United States Patent
Arkles et al.

(10) Patent No.: US 11,987,882 B2
(45) Date of Patent: May 21, 2024

(54) SILICON CARBIDE THIN FILMS AND VAPOR DEPOSITION METHODS THEREOF

(71) Applicant: Gelest, Inc., Morrisville, PA (US)

(72) Inventors: Barry C. Arkles, Pipersville, PA (US); Alain E. Kaloyeros, Slingerlands, NY (US)

(73) Assignee: GELEST, INC., Morrisville, PA (US)

( * ) Notice: Subject to any disclaimer, the term of this patent is extended or adjusted under 35 U.S.C. 154(b) by 0 days.

(21) Appl. No.: 17/486,286

(22) Filed: Sep. 27, 2021

(65) Prior Publication Data

US 2022/0098732 A1 Mar. 31, 2022

Related U.S. Application Data

(60) Provisional application No. 63/085,617, filed on Sep. 30, 2020.

(51) Int. Cl.
*H01L 21/02* (2006.01)
*C23C 16/02* (2006.01)
(Continued)

(52) U.S. Cl.
CPC .... *C23C 16/45536* (2013.01); *C23C 16/0209* (2013.01); *C23C 16/325* (2013.01)

(58) Field of Classification Search
CPC . C23C 16/325; C23C 16/45536; C23C 16/30; C23C 16/0209
See application file for complete search history.

(56) References Cited

U.S. PATENT DOCUMENTS

| 8,440,571 B2 | 5/2013 | Weidman et al. |
| 8,753,985 B2 | 6/2014 | Underwood et al. |
(Continued)

FOREIGN PATENT DOCUMENTS

| EP | 0392703 A2 | 10/1990 |
| EP | 0723600 A1 | 7/1996 |
(Continued)

OTHER PUBLICATIONS

Larkin Chem Mater 1992 V4 p. 24-27 (Year: 1992).*
(Continued)

*Primary Examiner* — Joseph A Miller, Jr.
(74) *Attorney, Agent, or Firm* — Panitch Schwarze Belisario & Nadel LLP

(57) ABSTRACT

A vapor deposition process is provided for the growth of as-deposited hydrogen-free silicon carbide (SiC) and SiC films including oxygen (SiC:O) thin films. For producing the SiC thin films, the process includes providing a silahydrocarbon precursor, such as TSCH (1,3,5-trisilacyclohexane), in the vapor phase, with or without a diluent gas, to a reaction zone containing a heated substrate, such that adsorption and decomposition of the precursor occurs to form stoichiometric, hydrogen-free, silicon carbide (SiC) in a 1:1 atom ratio between silicon and carbon on the substrate surface without exposure to any other reactive chemical species or co-reactants. For the SiC:O films, an oxygen source is added to the reaction zone to dope the SiC films with oxygen. In the silahydrocarbon precursors, every carbon atom is bonded to two silicon atoms, with each silicon atom being additionally bonded to two or more hydrogen atoms.

10 Claims, 6 Drawing Sheets

Representative XPS profile of Si and C concentrations versus penetration depth in SiC for films deposited at 850°C.

(51) Int. Cl.
*C23C 16/32* (2006.01)
*C23C 16/455* (2006.01)

(56) References Cited

U.S. PATENT DOCUMENTS

| | | | |
|---|---|---|---|
| 2012/0122302 A1* | 5/2012 | Weidman | H01L 21/02274 |
| | | | 118/723 R |
| 2013/0217239 A1 | 8/2013 | Mallick et al. | |
| 2013/0267079 A1* | 10/2013 | Underwood | C23C 16/325 |
| | | | 438/478 |
| 2019/0062911 A1* | 2/2019 | Sheedy | C23C 16/45553 |
| 2019/0376178 A1 | 12/2019 | Ridgeway et al. | |
| 2020/0071819 A1 | 3/2020 | Lei et al. | |

FOREIGN PATENT DOCUMENTS

| | | |
|---|---|---|
| TW | 202000677 A | 1/2020 |
| TW | 202012682 A | 4/2020 |
| WO | 2013039866 A2 | 3/2013 |

OTHER PUBLICATIONS

Gallis et al., "Photoluminescence at 1540 nm from erbium-doped amorphous silicon carbide films," J. Mater. Res., vol. 19, No. 8, pp. 2389-2393 (2004).
Kleinova et al., "FTIR spectroscopy of silicon carbide thin films prepared by PECVD technology for solar cell application," Proceedings of SPIE, vol. 9563, pp. 95630U-95631U (2015).
Zhang et al., "Structure and properties of hydrogenated amorphous silicon carbide thin films deposited by PECVD," Journal of Non-Crystalline Solids, vol. 354, pp. 1435-1439 (2008).
International Search Report and Written Opinion issued Mar. 22, 2022 in International Application No. PCT/US2021/052126.
Office Action issued Jul. 11, 2022 in TW Application No. 110136312 (with Partial English Summary).
Search Report issued May 26, 2022 in TW Application No. 110136312.
Office Action and Search Report issued Nov. 18, 2022 in TW Application No. 110136312 (partial summary).
Office Action issued Mar. 24, 2023 in TW Application No. 110136312 (with Partial English Summary).

* cited by examiner

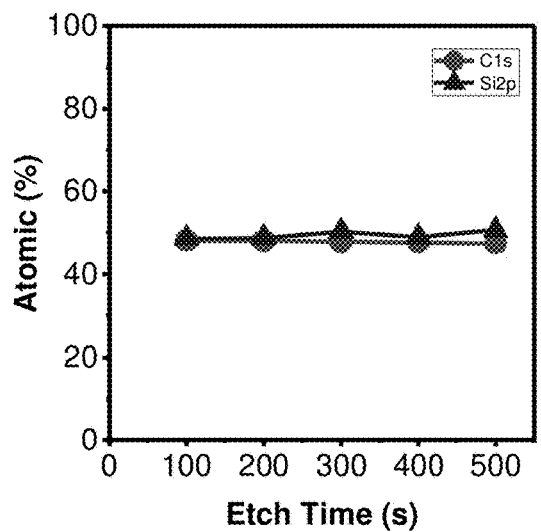
Fig 1. Representative XPS profile of Si and C concentrations versus penetration depth in SiC for films deposited at 850°C.
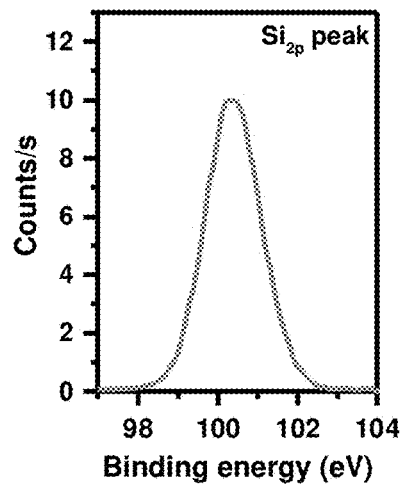
Figure 2. Representative high-resolution XPS spectrum for Si2p binding energy in SiC for films deposited at 850°C.

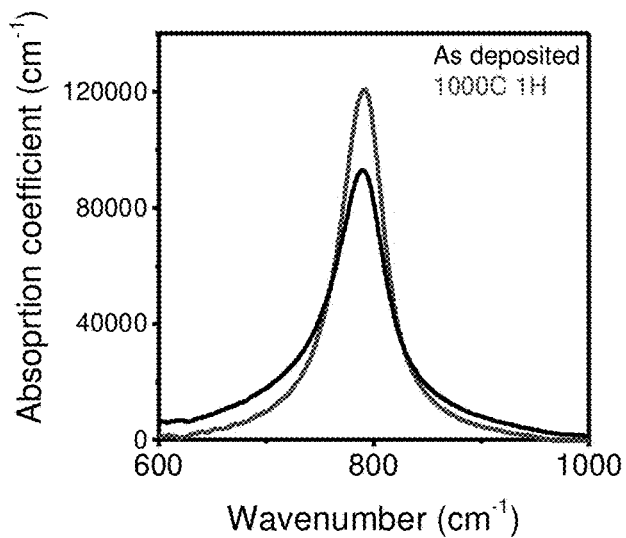
Fig. 3. FTIR absorption coefficient versus wavenumber for SiC deposited at 850°C (lower intensity peak with wider FWHM) and annealed at 1000°C (higher intensity peak with narrower FWHM).
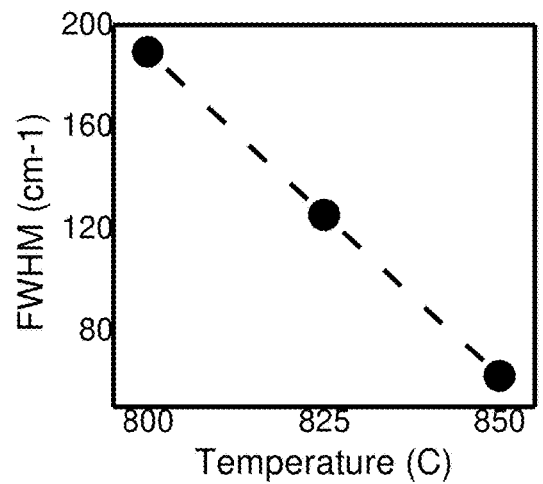
Fig.4. Graph of FWHM at FTIR peak for SiC thin films as function of deposition temperature.

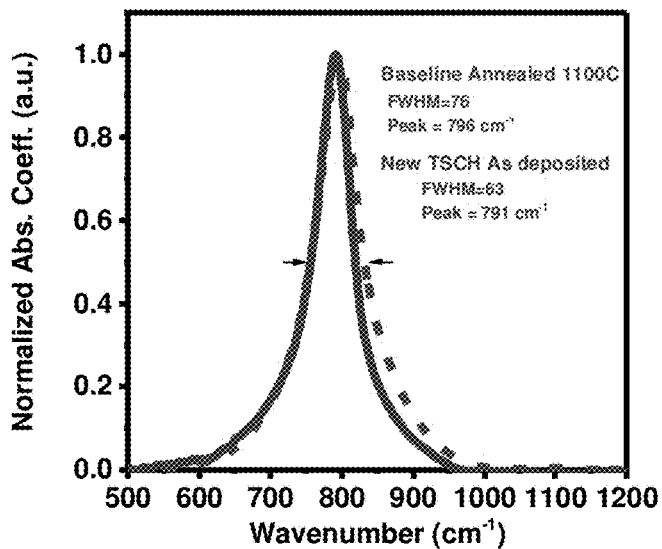
Fig. 5. FTIR normalized absorbance coefficient for as-deposited SiC films using TSCH as Si precursor versus post-annealed SiC films deposited using a baseline (control) Si-source precursor.
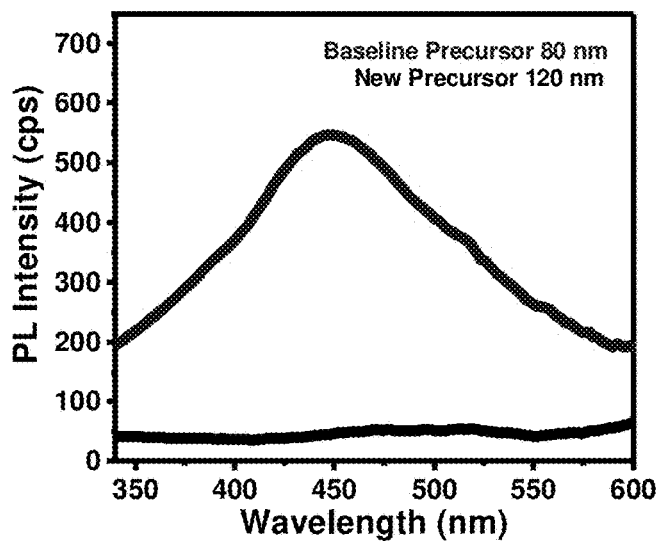
Fig. 6. Photoluminescence (PL) measurements for as-deposited SiC films using TSCH as Si precursor versus SiC films deposited using a baseline (control) Si-source precursor.

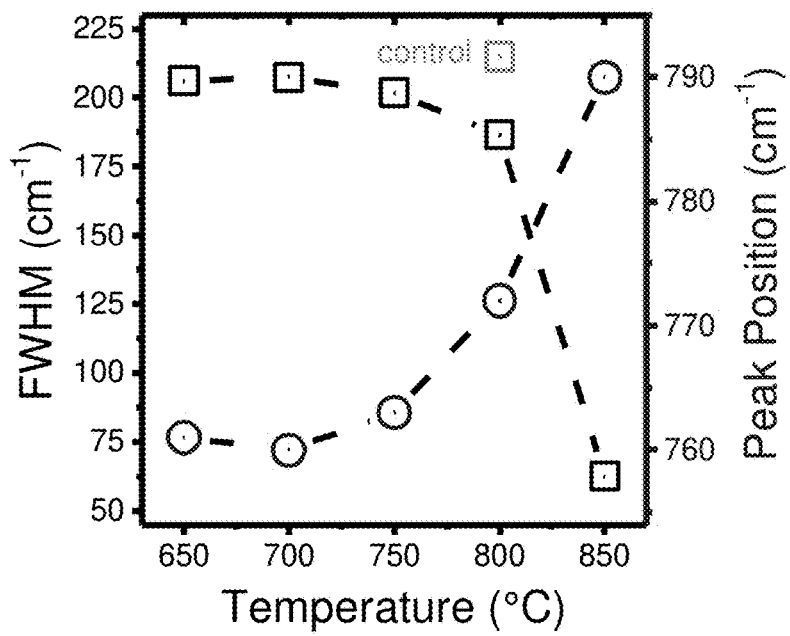
Fig. 7. FWHM and peak position of the SiC FTIR peak for inventive material and TMDSB control as a function of substrate temperature.
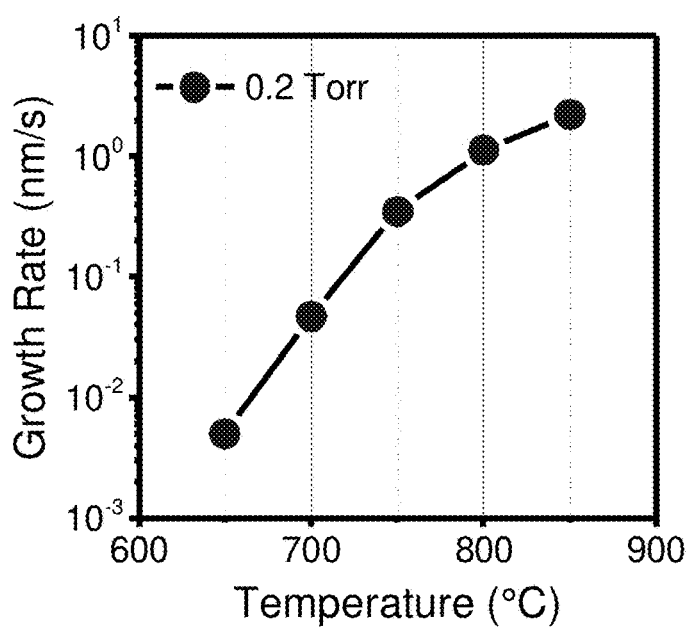
Fig. 8. Graph of growth rate as a function of deposition temperature for SiC films at 0.2 Torr.

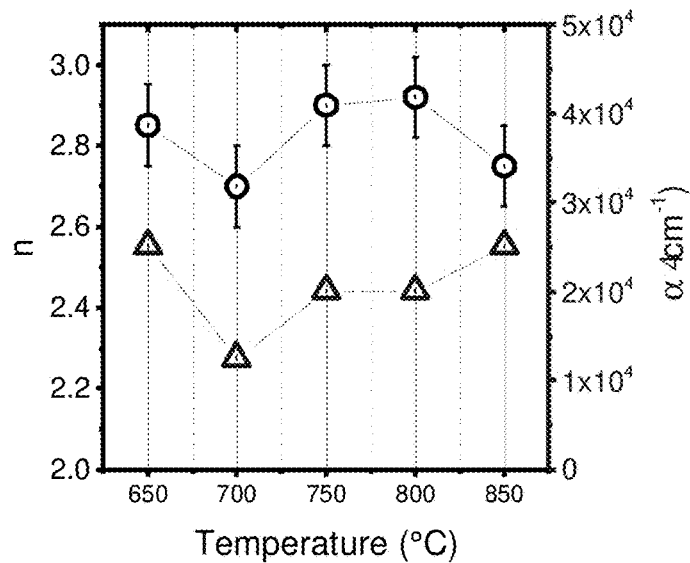
Fig. 9. The refractive index (n) and absorption coefficient (α) values for SiC films at 500nm wavelength as determined by ellipsometry versus substrate temperature.
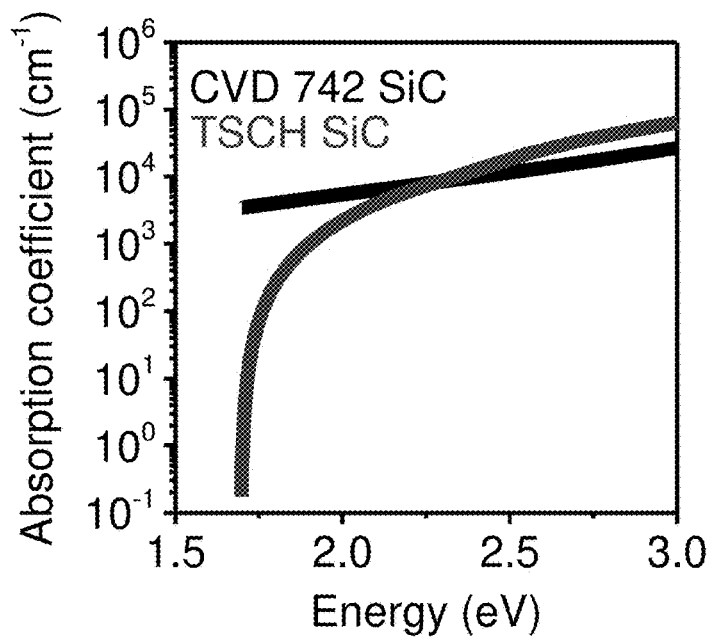
Fig. 10. Absorption coefficients for SiC grown at 650°C from TSCH versus a control (TMDSB) SiC sample.

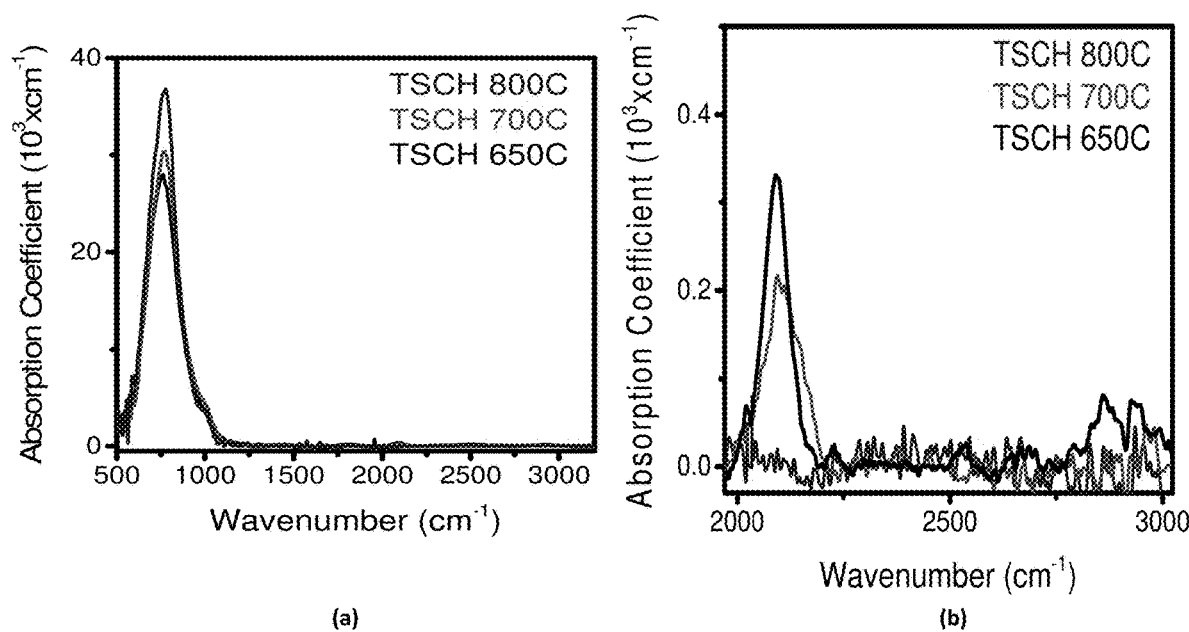
Fig. 11. (a) FTIR spectra for SiC samples deposited at 3 different temperatures (650°C, 700 °C, and 800°C) for the expanded wavenumber range from 500 to 3000 $cm^{-1}$; and (b) enlarged version of the absorption peak around 2090 $cm^{-1}$ from (a) corresponding to Si-H stretching mode to give a better perspective of the size of the Si-H peak.

SILICON CARBIDE THIN FILMS AND VAPOR DEPOSITION METHODS THEREOF

CROSS-REFERENCE TO RELATED APPLICATIONS

This application claims priority to U.S. Provisional Patent Application No. 63/085,617, filed Sep. 30, 2020, the entire disclosure of which is herein incorporated by reference.

BACKGROUND OF THE INVENTION

Silicon carbide (SiC) thin films are witnessing an ever-increasing intensity of research interest across multiple application sectors. The appeal of SiC coatings is attributed to their highly desirable combination of physical, mechanical, electrical, and optoelectronic properties, making them prime candidates for applications in the automotive, aerospace, computer chip, solar, light-emitting, and medical industries.

SiC coatings are employed as hard protective coatings under challenging thermal, environmental, and chemical conditions due to their high hardness (potentially in excess of 40 GPa), effective oxidation resistance, elevated temperature and thermal shock resistance, as well as chemical stability, and attractive mechanical, tribological and dielectric properties. Ultrathin SiC films are utilized in a broad spectrum of applications in integrated circuitry (IC) technologies, particularly in the microprocessor unit (MPU), system-on-a-chip (SoC), flash memory, and the vertical stacking of electronic devices in what is commonly referred to as three-dimensional (3D) integrated systems. For one, SiC is applied as a diffusion barrier in combination with low dielectric constant ($\kappa$) material replacements to silicon dioxide ($SiO_2$). Similarly, SiC is used as a capping layer and an etch stop for copper interconnects.

In an analogous manner, SiC thin films are successfully incorporated into active optical and optoelectronic devices due to their wide band gap (2.3 eV) and elevated electrical breakdown voltage, including panel displays, lighting, and light-emitting devices. In this respect, SiC thin films are employed as permeation barriers and encapsulation layers in light-emitting devices (LEDs) and organic LEDs (OLEDs), as well as in the fabrication of various planar optical systems and optical waveguides. Additionally, SiC coatings are suggested for use as passivation layers in flexible electroluminescent devices. The application of SiC also extends into the green energy field, primarily in solar cell applications. For example, microcrystalline and amorphous SiC coatings are employed as window layers in thin film solar cells. As with the hard coatings and computer chip industries, SiC thin films are applied as passivation layers in silicon solar cells.

Despite these extensive R&D efforts, significant challenges must be overcome to enable the extendibility of SiC thin films to emerging industrial usages, such as heterodevice applications. For one, the lion share of current SiC vapor phase deposition processes rely on the high temperature reaction of silane- or halide-type precursors, such as $SiH_4$, $Si_2H_6$, and $SiCl_4$, with C-containing precursors, such as $CHCl_3$, $C_3H_4$, $C_2H_2$, and $CCl_4$. The inherent challenges associated with the use of such chemistries are well documented and include their pyrophoric nature, numerous environmental, health, and safety issues, the incorporation of high levels of hydrogen in the resulting SiC films, and the need for post-deposition annealing to achieve the desired SiC film specifications. Two parameters for describing the quality of hydrogenated amorphous silicon carbide thin films are addressed in the empirical formula a-$Si_{1-x}C_{1+x}$:H where x is associated with substitutional bonding of hydrogen to the silicon atom, which prevents a 1:1 stoichiometry of Si to C atoms, and the :H represents doped (including possibly interstitial) H atoms that do not change the stoichiometry of Si:C from 1:1. It is highly desirable for good quality silicon carbide to possess the minimum level of both types of H defects.

Prior art efforts to address these challenges include the use of plasma-assisted atomic layer deposition (PA-ALD) of TSCH (1,3,5-trisilacyclohexane) at temperatures below 600° C., and preferably between 100 and 200° C. (U.S. Pat. No. 8,440,571); the application of ultra-violet light treatment to selectively remove some precursor ligands and attachments to realize molecular layer deposition (U.S. Pat. No. 8,753,985); and remote plasma processes to form plasma effluents that generate a flowable layer on a substrate (U.S. Patent Application Publication No. 2013/0217239). Unfortunately, all of these methodologies failed to deposit a true SiC phase which is stoichiometric and instead yielded films consisting of networks of silicon-carbon-hydrogen arrangements, with different ratios of silicon to carbon, varying hydrogen content, and significant defect levels. Not only is the inclusion of hydrogen a real concern due to its major impact on the physical, chemical, electrical, and optoelectronic properties of the film, but the nature of the Si—H versus C—H bonding also plays a major role in tailoring the resulting film characteristics.

Another influencing factor is the Pauling relative electro-negativity of the Si, C, and H elements (namely, Si:1.90; C:2.55; H:2.20). Si—C bonds have relatively high dipole moments, whereas Si—H bonds have relatively low dipole moments. Thus, even if the atomic percentage of film compositions prepared using known methods are identical, the resulting films may have different atom bonding arrangements and the dielectric properties of the resulting films may vary. Furthermore, the need for post-deposition high temperature annealing to remove H and reduce the density of defects adds complexity and cost and limits the use of such known processes to applications that do not require thermally fragile substrates.

Other attempts at resolving these issues included a soft templating approach (STA) using TSCH with the final material being defined by the self-assembly of a soluble directing agent (SDA) into a solvent; the SDA acted as a supramolecular template and the solvent had the function of SiC precursor. However, the process suffered from many challenges that rendered it highly undesirable for semiconductor, optical, and optoelectronic applications. These challenges include: (i) precursor pyrolysis is performed at very high temperature (1000° C.); (ii) the SDA medium requires a week to achieve polymerization; (iii) the resulting SiC cannot be grown as a thin film but a powder exhibiting a porous granular morphology as stacked spherical grains: and (iv) the STA process is a solvent based liquid phase which is not conducive for integration into the prevailing manufacturing processes of the semiconductor, energy, optical, and optoelectronic industries.

For these reasons, it would be desirable to provide a vapor deposition technique that overcomes the drawbacks of these and other known deposition techniques by forming high-quality, stoichiometric, as-deposited SiC thin films with minimal defect and hydrogen inclusion, while eliminating the issues associated with current silicon and carbon source precursors. It would further be desirable if the vapor deposition technique minimizes the number and complexity of current processing conditions, thereby maximizing process safety, efficiency, and productivity. It is also desirable if such a vapor deposition technique controls the SiC microstructure by varying the processing parameters, such as substrate temperature and precursor flow rate, without the need for a subsequent annealing step to achieve crystalline SiC.

BRIEF SUMMARY OF THE INVENTION

In one embodiment of the disclosure, a method for producing an as-deposited SiC thin film containing not more than 1 atomic % hydrogen onto a substrate in a reaction zone of a deposition chamber, comprises:
providing a substrate in a reaction zone of a deposition chamber;
heating a substrate to a temperature of about 600° C. to about 1000° C.; and
providing a precursor comprising a silahydrocarbon, wherein every carbon atom in the silahydrocarbon is bonded to two silicon atoms, with each silicon atom being additionally bonded to two or more hydrogen atoms, in the vapor phase without a carrier gas to the reaction zone containing the substrate; and
wherein a layer of SiC is formed on a substrate surface by adsorption and decomposition of the precursor;
wherein the adsorption and decomposition occur on the substrate surface without the presence of any other reactive chemical species or co-reactants.

In another embodiment, the disclosure provides a method for producing an as-deposited SiC thin film containing not more than 0.2 atomic % hydrogen onto a substrate in a reaction zone of a deposition chamber, the method comprising:
providing a substrate in a reaction zone of a deposition chamber;
heating a substrate to a temperature of about 700° C. to about 1000° C.; and
providing a precursor comprising a silahydrocarbon, wherein every carbon atom in the silahydrocarbon is bonded to two silicon atoms, with each silicon atom being additionally bonded to two or more hydrogen atoms, in the vapor phase without a carrier gas to the reaction zone containing the substrate;
wherein a layer of SiC is formed on a substrate surface by adsorption and decomposition of the precursor;
wherein the adsorption and decomposition occur on the substrate surface without the presence of any other reactive chemical species or co-reactants. In a further embodiment, the disclosure provides a method for producing an as-deposited SiC:O thin film containing not more than 1 atomic % hydrogen onto a substrate in a reaction zone of a deposition chamber, the method comprising:
providing a substrate in a reaction zone of a deposition chamber;
heating a substrate to a temperature of about 600° C. to about 1000° C.;
providing a precursor comprising a silahydrocarbon, wherein every carbon atom in the silahydrocarbon is bonded to two silicon atoms, with each silicon atom being additionally bonded to two or more hydrogen atoms, in the vapor phase without a carrier gas to the reaction zone containing the substrate; and
simultaneously providing a co-reactant reactive oxygen-containing gas to the reaction zone containing the substrate;
wherein a layer of SiC:O is formed on a substrate surface by adsorption and decomposition of the precursor.

BRIEF DESCRIPTION OF THE SEVERAL VIEWS OF THE DRAWINGS

The following detailed description of preferred embodiments of the present invention will be better understood when read in conjunction with the appended drawing. For the purposes of illustrating the invention, there are shown in the drawings embodiments which are presently preferred. It is understood, however, that the invention is not limited to the precise arrangements and instrumentalities shown. In the drawings:

FIG. 1 is a representative XPS profile of Si and C concentrations versus penetration depth in SiC for films deposited at 850° C. according to an embodiment of the disclosure showing an Si:C atomic ratio ranging from 1:0.98 to 1:1.02 (nominally 1:1);

FIG. 2 is a representative high-resolution XPS spectrum for Si2p binding energy in SiC for films deposited at 850° C. according to an embodiment of the disclosure, corresponding to stoichiometric Si:C;

FIG. 3 is a graph of FTIR absorption coefficient versus wavenumber for SiC deposited at 850° C. and annealed at 1000° C. according to an embodiment of the disclosure;

FIG. 4 is a graph of FWHM at FTIR peak for SiC as a function of deposition temperature according to an embodiment of the disclosure;

FIG. 5 depicts the FTIR normalized absorbance coefficient for as-deposited SiC films using TSCH as Si precursor according to an embodiment of the disclosure versus post-annealed SiC films deposited using a baseline (control) Si-source precursor;

FIG. 6 depicts photoluminescence (PL) measurements for as-deposited SiC films using TSCH as Si precursor according to an embodiment of the disclosure versus SiC films deposited using a baseline (control) Si-source precursor;

FIG. 7 depicts FWHM and peak position of the SiC FTIR peak for an SiC material according to an embodiment of the disclosure and a TMDSB control as a function of substrate temperature;

FIG. 8 is a graph of growth rate as a function of deposition temperature for SiC films at 0.2 Torr according to embodiments of the disclosure;

FIG. 9 plots the refractive index (n) and absorption coefficient (a) values for SiC films at 500 nm wavelength as determined by ellipsometry versus substrate temperature according to embodiments of the disclosure;

FIG. 10 is a graph of the absorption coefficients for SiC grown at 650° C. from TSCH versus a control (TMDSB) SiC sample according to an embodiment of the disclosure;

FIG. 11 (a) are FTIR spectra for SiC samples deposited at three different deposition temperatures (650° C., 700° C., and 800° C.) according to embodiments of the disclosure for the expanded wavenumber range from 500 to 3000 $cm^{-1}$; and FIG. 11 (b) is an enlarged version of the absorption peak around 2090 $cm^{-1}$ from FIG. 11(a) corresponding to the Si—H stretching mode to give a better perspective of the size of the Si—H peak.

DETAILED DESCRIPTION OF THE INVENTION

The disclosure relates to vapor deposition processes for producing as-deposited crystalline and amorphous silicon carbide (SiC) thin films and SiC films including oxygen (SiC:O thin films) having extremely low concentrations of structural and compositional defects, in particular defects associated with variations from the ideal stoichiometry of silicon carbide (Si:C=1:1) and substitutional and interstitial defects associated with the presence of hydrogen, as well as to the films produced from such processes. It is generally considered in the art that thin silicon carbide films with levels of 10 atomic % hydrogen or less are considered to exhibit "low levels of hydrogen incorporation" and that films having hydrogen levels of 1 atomic % or less are considered to be "hydrogen free" (see, for example, A. Kleinováet al, "FTIR spectroscopy of silicon carbide thin films prepared by PECVD technology for solar cell application," *Proc. SPIE* 9563, *Reliability of Photovoltaic Cells, Modules, Components, and Systems VIII*, 95630U (September 2015); S. Gallis et al "Photoluminescence at 1540 nm from erbium-doped amorphous silicon carbide films" *J. Mater. Res.*, 19(8), 2389-2893, 2004).

The processes described herein may be used to produce both SiC films with low levels of hydrogen incorporation and hydrogen-free SiC films, as defined above, as well as SiC:O thin films. Consistent with the current terms of art, a film containing "a low level of hydrogen" means that the film contains 10 atomic % hydrogen or less, "hydrogen-free" means that the film contains 1 atomic % or less hydrogen, and a film with "non-detectable" hydrogen contains 0.2 atomic % or less hydrogen. For the purposes of this disclosure, silicon carbide films with non-detectable hydrogen may also be understood to refer to films having hydrogen contents below the detection limits of spectroscopy methods and apparatuses, such as infrared spectroscopy (IR) and X-ray photoelectron spectroscopy (XPS), which is estimated to be at or below 0.2 atomic %.

The term "thin film" is well understood in the art, and may include films ranging in thickness from a few nanometers to a few microns. More specifically, the term "thin film" may be understood to refer to a film having a thickness of less than 500 nm and preferably between 2 and 50 nm. The phrase "as-deposited" would be understood in the art to mean that the film has the properties of utility immediately after deposition without further treatment such as plasma processes, irradiation, or thermal annealing.

For producing SiC thin films, the processes according to the disclosure involve providing a silahydrocarbon precursor as described below, such as the preferred TSCH (1,3,5-trisilacyclohexane), in the vapor phase, with or without a carrier or diluent gas, to a reaction zone containing a heated substrate, such that adsorption and decomposition of the precursor occurs to form stoichiometric silicon carbide (SiC) in a Si:C atomic ratio ranging from 1:0.98 to 1:1.02, nominally 1:1, on the substrate surface without additional exposure to any other reactive chemical species or co-reactants. For forming SiC:O films, an oxygen source is added to the reaction zone to modulate doping. Alternatively, the as-deposited SiC films may be subsequently reacted or treated with an oxygen source. The grain size and morphology of the SiC and SiC:O films can be modulated by controlling the processing parameters, such as substrate temperature and precursor flow rate, without the need for a subsequent annealing step to achieve crystalline films. However, annealing may also be implemented if larger crystalline grains or epitaxial phase are desirable.

The vapor deposition techniques described herein overcome the drawbacks of known deposition techniques and enable the growth of high-quality, stoichiometric, as-deposited SiC thin films with 1% or less defects and/or hydrogen without the need for post deposition annealing, while eliminating the issues associated with current Si and C source precursors and minimizing the number and complexity of present processing conditions, thereby maximizing process safety, efficiency, and productivity.

The resulting SiC thin films would be highly advantageous for critical applications in the semiconductor, energy, optical, and optoelectronic industries. In particular, the presence of extremely low levels of defects and hydrogen in the as-deposited SiC thin films make them ideal for incorporation in optical and photoluminescent devices in which the inclusion of defects and hydrogen in as-deposited SiC tend to hinder optical and photoluminescent performance and require high-temperature annealing to remedy such deficiencies. In contrast, the presence of extremely low levels of defects and hydrogen in as-deposited SiC films as described herein enables the micromodulation of the concentration and optical performance of dopants, such as oxygen and erbium, and maximizes optical and photoluminescent performance in the resulting devices and systems.

The processes according to the disclosure employ a class of silicon- and carbon-containing source precursors, carbosilanes, alternately denoted silahydrocarbons, in which every carbon atom in the silahydrocarbon is bonded to two silicon atoms, with each silicon atom being additionally bonded to two or more hydrogen atoms. The ratio of silicon atoms to carbon atoms in the precursor is preferably in the range of about 1 to 1.5. Exemplary precursors include 1,3,5,7-tetrasilanonane; 1,3,5,7-tetrasilacyclooctane; tricyclo[3.3.1.13,7] pentasilane; and 1,3-disilacyclobutane (which are not readily available), and preferred commercially available precursors include 1,3,5-trisilapentane and 1,3,5-trisilacyclohexane (TSCH); the most preferred is the commercially available cyclic carbosilane 1,3,5-trisilacyclohexane (TSCH). Unlike silane- or halide-type silicon precursors such as $SiH_4$, $Si_2H_6$, and $SiCl_4$, this class of Si precursors contains both silicon and carbon atoms, thus providing a decomposition pathway for the formation of stoichiometric SiC without the need for a carbon-containing co-reactant. The chemical structure and bonding configuration of the silahydrocarbon-type precursors such as TSCH enable decomposition which yields stoichiometric SiC at lower temperatures than are required in the reaction of silane- or halide-type precursors, such as $SiH_4$, $Si_2H_6$, and $SiCl_4$, with carbon-containing precursors, such as $CHCl_3$, $C_3H_4$, $C_2H_2$, and $CCl_4$, and without the need for a post-deposition annealing step.

Appropriate substrates include the preferred silicon, as well as, for example and without limitation, silicon oxide, silicon nitride, silicon carbide, gallium nitride, cobalt, ruthenium, copper, platinum, titanium, titanium nitride, tantalum, tantalum nitride, substrates that are used in optical and photoluminescence applications, among others.

An important aspect of the vapor deposition techniques described herein is that the processes are based on tightly controlled experimental conditions including source precursor temperature, substrate temperature, precursor flow rate, precursor partial pressure in the reaction zone, and total process pressure to ensure that the source precursor decomposition pathways occur in the surface-reaction-limited regime and not the mass-transport-limited regime. These parameters ensure tight control of the adsorption and decomposition mechanisms of the silahydrocarbon-type precursors to optimize the energetics of ligand removal and hydrogen-elimination, while maintaining the integrity of Si—C bonds to yield a 1:1 Si:C ratio in the resulting films.

In this surface-reaction-limited regime, and while not wishing to be bound by theory, the methods described herein ensure that two critical processes are occurring: (i) an elimination reaction in which a Si—C double bond structure "silene," is formed, followed by (ii) a dissociative adsorption of hydrogen from the silicon atoms, which, depending on deposition parameters, particularly substrate temperature, produces SiC films that can be described as films with low hydrogen content<10 atom % hydrogen), hydrogen-free (less than 1 atom % hydrogen) or having no detectable hydrogen content (<0.2% atom % hydrogen). Further, the resulting SiC films consist only of simple cross-linked Si—C bonds with less than 0.2% variation from 1:1 Si:C stoichiometry (which can be expressed as a range of 1:0.98 to 1:1.02), regardless of substrate deposition temperature. These films are in stark contrast to prior art films in which the SiC matrix exhibits a transition from predominantly C—Si to C—C, C—Si, and C—H type bonds, while silicon evolved from Si—C bonds to Si—C, Si—Si, and Si—H bonds as function of processing conditions, resulting in various temperature-dependent complex bonding configurations in SiC films with the inclusion of a high defect density and significant hydrogen content.

"Low hydrogen content" may also be understood to refer to a material in which a ratio of the integrated area under the Si—H bond peak at ~2080 cm$^{-1}$ to the integrated area under the Si—C bond peak at ~730 cm$^{-1}$ as measured by infrared spectroscopy is less than 1:50 using standard spectroscopy techniques. "Low hydrogen content" may further be understood to refer to a material in which a ratio of the Si—H bond density to the Si—C bond density of less than 1:50 ratio as measured by infrared spectroscopy. It should be noted that the ratio of these IR absorption peaks is simply a correlation demonstrating extremely low levels of Si—H bonds below the detection limits of IR. Alternatively, a low level of hydrogen incorporation (as well as other defects as described above) could be determined by observing an undoped SiC absorption coefficient below $10^3$ cm$^{-1}$ in the visible optical band when excited @ 1.75 eV using spectroscopic ellipsometry.

In a preferred embodiment, films having 1:1 Si:C stoichiometry and no detectable hydrogen (less than 0.2 atomic %) can be prepared at substrate deposition temperatures greater than about 700° C. and less than about 1000° C. In other embodiments, in which higher contents of hydrogen are acceptable but 1:1 Si:C stoichiometry is still a requirement, process temperatures are in the range of between about 600° C. and about 700° C., which has benefits both in terms of less exposure of devices to thermal damage and energy efficiency. For example, at deposition temperatures of 650° C., hydrogen content of the films is detectable at levels estimated at 0.2-1.0 atomic % while film stoichiometry is maintained. It is noted that the above ranges are intended to include all temperatures within these ranges such as, but not limited to, 600° C., 625° C., 650° C., 675° C., 700° C., 725° C., 750° C., 775° C., 800° C., 825° C., 850° C., 875° C., 900° C., 925° C., 950° C., 975° C., and 1000° C. Preferred substrate deposition temperatures are about 700° C. to about 850° C., such as 700° C., 725° C., 750° C., 775° C., 800° C., 825° C., and 850° C.

In one embodiment, aspects of the disclosure relate to a method for producing as-deposited, hydrogen-free (not more than 1 atomic % hydrogen), crystalline SiC thin films which involves providing a silahydrocarbon-type precursor as described above, such as the preferred TSCH, in the vapor phase, without a carrier gas, to a reaction zone of a deposition chamber containing a heated substrate as described above at a temperature of about 600° C. to about 1000° C. (preferably about 700° C. to about 1000° C.), such that adsorption and decomposition of the TSCH or other precursor occurs on the substrate surface to form a layer of SiC on the substrate without the presence of any other reactive chemical species or co-reactants. The decomposition process yields as-deposited, hydrogen-free, crystalline SiC films, without the need for a post-deposition annealing step. It is also within the scope of the disclosure to provide the precursor in the vapor phase with a diluent inert non-reactive gas, as this may offer practical advantages or convenience, but the diluent gas is not required.

The source temperature of the TSCH or other precursor is maintained at about −25 to about 75° C., more preferably at about 0 to about 25° C., and the partial vapor pressure of the precursor in the deposition chamber is maintained at about 10% to about 100% of the total pressure in the reaction zone, more preferably at about 50% to about 90% of the total pressure in the reaction zone; the remaining partial pressure is from the diluent gas, if present. If there is no diluent gas, the vapor pressure of the precursor is the total pressure of the system, and no diluent or carrier gas is needed since the precursor vapor pressure alone sustains the total pressure (vacuum) in the system. The substrate deposition temperature is maintained at about 600° C. to about 1000° C., and more preferably at about 700 to about 850° C. The total pressure in the reaction zone (deposition chamber), also referred to as working pressure, is maintained at about 0.1 torr to about 760 torr, and more preferably 0.2 torr to 10 torr. Also, the diluent gas flow rate (if employed) is maintained at from about 10 to about 1000 sccm, and more preferably 50 to 250 sccm.

The diluent gas, if employed, is selected from known inert gases such as helium, neon, argon, and xenon.

Employing these process parameters to form an SiC film ensures a Si:C stoichiometry of 1:1±0.05, preferably 1:1±0.02 (1:1.098 to 1:1.02) as measured by XPS and with less than 1 atomic percent hydrogen as measured by infrared spectroscopy. Further, a ratio of the integrated area under the Si—H bond peak at ~2080 cm-1 for the SiC film as measured by infrared spectroscopy to the integrated area under the Si—C bond peak at ~730 cm-1 as measured by infrared spectroscopy is less than about 1:50.

In another embodiment, aspects of the disclosure relate to a method for producing as-deposited, crystalline SiC films with non-detectable concentrations (not more than 0.2 atomic %) of H (both interstitial and substitutional) and defects. The method involves providing TSCH or another silahydrocarbon-type precursor as described above in the vapor phase to a reaction zone of a deposition chamber containing a heated substrate as described above at a temperature of about 700° C. to about 1000° C. (preferably about 700° C. to about 850° C.), such that adsorption and decomposition of TSCH or other precursor occurs on the substrate surface in the presence of the diluent inert non-reactive gas to form a layer of SiC on the substrate and without the intervention of any other reactive chemical species or co-reactants. The decomposition process yields as-deposited, crystalline SiC films, with non-detectable H (both interstitial and substitutional) and defects as described above without the need for a post-deposition annealing step. It is also within the scope of the disclosure to provide the precursor in the vapor phase with a diluent inert non-reactive gas, as this may offer practical advantages or convenience, but the diluent gas is not required.

The source temperature of the TSCH or other precursor is maintained at about −25 to about 75° C., more preferably at about 0 to about 25° C., and the partial vapor pressure of the precursor in the deposition chamber is maintained at about 10% to about 100% of the total pressure in the reaction zone, more preferably at about 50% to about 90% of the total pressure in the reaction zone; the remaining partial pressure is from the diluent gas, if present. If there is no diluent gas, the vapor pressure of the precursor is the total pressure of the system, and no diluent or carrier gas is needed since the precursor vapor pressure alone sustains the total pressure (vacuum) in the system. The substrate deposition temperature is maintained at about 700° C. to about 1000° C., and more preferably at about 700 to about 850° C. The total pressure in the reaction zone (deposition chamber), also referred to as working pressure, is maintained at about 0.1 torr to about 760 torr, and more preferably 0.2 torr to 10 torr. Also, the diluent gas flow rate (if employed) is maintained at from about 10 to about 1000 sccm, and more preferably 50 to 250 sccm.

The diluent gas, if employed, is selected from known inert gases such as helium, neon, argon, and xenon.

Employing these process parameters to form an SiC film ensures a Si:C stoichiometry of 1:1±0.05, preferably 1:1±0.02 (1:1.098 to 1:1.02) and with less than 1 atomic percent hydrogen. Further, a ratio of the integrated area under the Si—H bond peak at ~2080 cm-1 for the SiC film as measured by infrared spectroscopy to the integrated area under the Si—C bond peak at ~730 cm-1 as measured by infrared spectroscopy is less than about 1:50.

In a further embodiment, aspects of the disclosure relate to a method for producing as-deposited, SiC:O films containing not more than 1 atomic % hydrogen. The method involves providing TSCH (or other precursor as defined above) in the vapor phase, without a carrier or diluent gas, to a reaction zone of a deposition chamber containing a heated substrate at a temperature of about 600° C. to about 1000° C. (preferably about 700° C. to about 850° C.), as described above, and simultaneously introducing an oxygen-containing gas to the reaction zone of the deposition chamber, such that adsorption and decomposition of TSCH occurs on the substrate surface with the presence of the reactive oxygen-containing gas as a co-reactant to form a layer of SiC:O on the substrate surface. It is also within the scope of the disclosure to provide the precursor in the vapor phase with a diluent inert non-reactive gas, as this may offer practical advantages or convenience, but the diluent gas is not required. The decomposition process yields as-deposited, hydrogen-free SiC:O films, i.e., films containing not more than 1 atomic % hydrogen.

The source temperature of the TSCH or other precursor is maintained at about −25 to about 75° C., and more preferably about 0 to about 25° C., and the TSCH partial vapor pressure in the deposition chamber is maintained at about 10% to about 100% of the total pressure in the reaction zone, and more preferably at about 50% to about 90% of the total pressure in the reaction zone. The oxygen-containing gas co-reactant flow rates are set to achieve a corresponding partial vapor pressure in the reaction zone of about 1% to about 25% of that of the carbosilane precursor, and more preferably about 5% to about 10% of the carbosilane precursor. The substrate deposition temperature is maintained at about 600° C. to about 1000° C., and more preferably about 700 to about 850° C. The total pressure in the reaction zone (deposition chamber), also referred to as working pressure, is maintained at about 0.1 torr to about 760 torr, and more preferably 0.2 torr to 10 torr. Also, the diluent gas flow rate (if employed) is maintained at from about 10 to about 1000 sccm, and more preferably 50 to 250 sccm.

The diluent gas, if employed, is selected from known inert gases such as helium, neon, argon, and xenon. The oxygen-containing gas co-reactant is selected from a group consisting of oxygen, water, ozone, nitrous oxide, and other typical oxygen containing reactants which are known in the art.

Alternatively, the as-deposited SiC films may be subsequently treated in-situ (prior to removal from the deposition chamber) or ex-situ (by removing them from the deposition chamber and placing them in a furnace or annealing chamber) by exposure to an oxygen-containing source to form SiC:O films.

It is also within the scope of the disclosure to replace some or all of the hydrogen atoms which are bonded to the silicon atoms in the precursors with deuterium atoms. This offers the advantage of eliminating substitutional defects associated with Si—H bond infrared absorption in the range of 2000-2260 $cm^{-1}$ and even further reduces the overall concentration of interstitial defects (if they exist) since deuterium has less tendency than hydrogen to cause the dislocations associated with hydrogen in amorphous silicon and silicon carbide systems. In the case of trisilacyclohexane, all six of the hydrogen atoms are replaced with deuterium atoms. This compound is readily produced by utilizing lithium aluminum deuteride to reduce a hexaalkoxyltrisilacyclohexane intermediate. As another example, the eight hydrogen atoms bonded to silicon in trisilapentane can be replaced with deuterium in a similar fashion.

The invention will now be described in connection with the following, non-limiting examples. These examples describe the deposition of stoichiometric SiC films from TSCH (1,3,5-trisilacyclohexane) on Si substrates with extremely low levels of defects and hydrogen.

Example 1: Identification of Optimized Process Window

Six stoichiometric SiC films were produced by the decomposition of TSCH (1,3,5-trisilacyclohexane) on Si substrates using the processing parameters summarized in Table I.

TABLE I

| | Processing parameters for producing SiC from TSCH as source precursor | | | | | | |
|---|---|---|---|---|---|---|---|
| Run | Precursor Source Temperature (° C.) | Precursor Flow Rate (sccm) | Substrate Temperature (° C.) | Pressure (Vacuum) (torr) | Dilution Gas (Ar) Flow Rate (sccm) | Precursor Partial Pressure in reaction zone (torr) | Film Thickness (nm) |
| 1 | 50° C. | 1 | 800 | 0.50 | 200 | 0.40 | 65 |
| 2 | 50° C. | 1 | 850 | 0.50 | 200 | 0.40 | 89 |
| 3 | 50° C. | 1 | 850 | 0.50 | 200 | 0.40 | 32 |
| 4 | 50° C. | 1 | 825 | 0.50 | 200 | 0.40 | 36 |

TABLE I-continued

Processing parameters for producing SiC from TSCH as source precursor

| Run | Precursor Source Temperature (° C.) | Precursor Flow Rate (sccm) | Substrate Temperature (° C.) | Pressure (Vacuum) (torr) | Dilution Gas (Ar) Flow Rate (sccm) | Precursor Partial Pressure in reaction zone (torr) | Film Thickness (nm) |
|---|---|---|---|---|---|---|---|
| 5 | 50° C. | 1 | 800 | 0.50 | 200 | 0.40 | 37 |
| 6 | 50° C. | 1 | 850 | 0.50 | 100 | 0.45 | 120 |

The resulting films were analyzed by x-ray photoelectron spectroscopy (XPS), Fourier-transform infrared spectroscopy (FTIR), and photoluminescence (PL) measurements.

Si and C concentrations versus penetration depth in the SiC films were assessed by XPS depth profile analyses, as shown in FIGS. 1 and 2 for as-deposited SiC films grown at substrate temperatures of 850° C. Similar data were obtained for runs 2, 3, and 6 above, demonstrating the robustness of the deposition process. The data demonstrate a consistent 1:1 Si:C atomic ratio throughout the films with an accuracy of 1:0.98 to 1:1.02, demonstrating that the films are stoichiometric. The high-resolution XPS spectrum for Si2p

Example 2: Investigation of Process Parameters and Precursor Chemistry

Ten inventive stoichiometric SiC films were produced by the decomposition of TSCH (1,3,5-trisilacyclohexane) on Si substrates, and two comparative SiC films (Runs 7 and 14) were produced as a control by the decomposition of TMDSB (1,1,3,3-tetramethyl-1,3-disilacyclobutane) as a precursor on Si substrates. The processing parameters are summarized in Table II below.

TABLE II

Processing parameters for producing inventive and comparative SiC films

| Run | Precursor Source Temperature (° C.) | Precursor | Precursor Flow Rate (sccm) | Substrate Temperature (° C.) | Pressure (Vacuum) (torr) | Dilution Gas (Ar) Flow Rate (sccm) | Precursor Partial Pressure in reaction zone (torr) |
|---|---|---|---|---|---|---|---|
| 7 | 50° C. | TMDSB as control or baseline | 10 | 800 | 1 | 400 | 0.40 |
| 8 | 50° C. | TSCH | 1 | 400 | 1 | 200 | 0.40 |
| 9 | 50° C. | TSCH | 1 | 450 | 1 | 200 | 0.40 |
| 10 | 50° C. | TSCH | 1 | 500 | 1 | 200 | 0.40 |
| 11 | 50° C. | TSCH | 1 | 550 | 1 | 200 | 0.40 |
| 12 | 50° C. | TSCH | 1 | 600 | 0.2 | 200 | 0.15 |
| 13 | 50° C. | TSCH | 1 | 650 | 0.2 | 200 | 0.15 |
| 14 | 50° C. | TMDSB as control or baseline | 10 | 800 | 1.5 | 400 | 0.15 |
| 15 | 50° C. | TSCH | 1 | 700 | 0.2 | 200 | 0.15 |
| 16 | 50° C. | TSCH | 1 | 750 | 0.2 | 200 | 0.15 |
| 17 | 50° C. | TSCH | 1 | 800 | 0.2 | 200 | 0.15 |
| 18 | 50° C. | TSCH | 1 | 850 | 0.2 | 200 | 0.15 |

*(1,1,3,3-tetramethyl-1,3-disilacyclobutane)

binding energies is displayed in FIG. 8 for SiC films deposited at 800° C.; both runs 1 and 5 (different film thicknesses) gave the same XPS spectra. The Si2p binding energy location at 100.3 eV confirms that the chemical bonding corresponds to Si—C(standard use: 3C—SiC).

FTIR analysis shows the following: (i) As shown in FIG. 3, a single strong absorption peak is observed around 800 $cm^{-1}$, corresponding to Si—C stretching mode in crystalline SiC. The FWHM of the FTIR peak decreases from 62.0 to 49.8 $cm^{-1}$ after annealing at 1000° C. for 1 hour, indicating an increase in crystallinity due to annealing. (ii) As shown in FIG. 4, the FWHM of the FTIR peak decreases with increasing deposition temperature, suggesting increased deposited crystallinity with the rise in deposition temperature.

FIG. 5 displays a comparison of the degree of crystallinity between post-annealed SiC films deposited using the baseline source precursor as a control and as-deposited SiC films using TSCH as the precursor. The FTIR spectra show that the as-deposited SiC films using the TSCH precursor exhibit the same 100% crystallinity as the SiC films deposited from the baseline Si-source precursor after annealing at 1100° C. It is noted that no deposition occurred for the baseline precursor TMDSB below 800° C. and the as-deposited SiC from the comparative materials incorporated high levels of H (more than 11 at %) and defects.

Photoluminescence (PL) measurements are shown in FIG. 6 for SiC films deposited using the baseline TMDSB control precursor and SiC films using TSCH as the precursor. It may be seen that the SiC films using TSCH as a precursor exhibit negligible to no PL intensity, indicating a significantly reduced defect density in comparison with the SiC films deposited using the baseline (TMDSB) Si-source precursor.

FIG. 7 is a graph of FWHM and peak position of the SiC FTIR peak for the TMDSB control and TSCH inventive samples as s function of substrate temperature. The smaller FWHM and red-shifted peak position with the rise in substrate temperature indicates higher crystallinity at higher deposition temperature.

Also, the growth rate as a function of deposition temperature at 0.2 Torr is shown in FIG. 8. The highest growth rate, observed at 850° C., was 2.23 nm/s. As expected, the growth rate decreases with lower substrate temperature due to the reduction in the thermal energy available to the precursor decomposition reaction.

Representative atomic force microscopy (AFM) micrographs of the SiC samples as a function of substrate temperature were measured (not shown). The root-mean-square (rms) surface roughness increased with higher substrate temperature. This result is expected and is attributed to the increased crystallinity with higher substrate temperature.

Scanning electron microscope (SEM) results (not shown) for substrate temperatures of 800° C., 700° C., and 650° C., showed good correlation with the AFM data in terms of rms surface roughness, which increased with higher substrate temperature.

The refractive index (n) and absorption coefficient (a) values for the SiC films at 500 nm wavelength as determined by ellipsometry are plotted versus deposition temperature in FIG. 9; n values are represented by circles and a values are represented by triangles. The refractive index n varied between 2.9 and 2.7 for all deposition temperatures, which is consistent with the reference value for 3C—SiC (2.7), indicating a stoichiometric SiC phase.

Furthermore, a comparison of absorption coefficient for SiC grown at 650° C. from TSCH versus the control TMDSB SiC sample is shown in FIG. 10. The TSCH SiC film shows a drastic decrease in absorption in the visible range, in stark contrast with the control SiC sample which exhibits high absorption throughout that energy range. This clearly demonstrates a significantly lower defect density for SiC grown at 650° C. from TSCH versus the control SiC sample.

Finally, FIG. 11(a) depicts the FTIR spectra for inventive SiC samples deposited at 3 different temperatures (650° C., 700° C., and 800° C.) for the expanded wavenumber range from 500 to 3000 $cm^{-1}$. The FTIR spectra show the following: (i) a single highly intense absorption peak around 800 $cm^{-1}$ corresponding to Si—C stretching mode in crystalline SiC; and (ii) and an extremely small absorption peak around 2090 $cm^{-1}$ corresponding to Si—H stretching mode for the sample grown at 650° C. The Si—H peak is reduced to below background signal for the samples deposited at 700° C. and 800° C., indicating that H in the SiC samples is below the detection limits of FTIR. FIG. 11(b) is an enlarged version of the absorption peak around 2090 $cm^{-1}$ corresponding to Si—H stretching mode to give a better perspective of the size of the Si—H peak.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for producing an as-deposited SiC thin film containing not more than 1 atomic % hydrogen onto a substrate in a reaction zone of a deposition chamber, the method comprising:
   providing a substrate in a reaction zone of a deposition chamber;
   heating the substrate to a temperature of about 700° C. to about 850° C.; and
   providing a precursor comprising 1,3,5,7-tetrasilanonane; tricyclo[3.3.1.13,7]pentasilane; 1,3-disilacyclobutane; 1,3,5-trisilacyclohexane (TSCH); or 1,3,5,7-tetrasilacyclooctane in the vapor phase without a carrier gas to the reaction zone containing the substrate while maintaining the substrate at about 700° C. to about 850° C.;
   wherein a partial pressure of the precursor in the deposition chamber is maintained at about 10% to about 100% of a total pressure in the reaction zone; and
   wherein a layer of SiC containing not more than 1 atomic % hydrogen is formed on a substrate surface by adsorption and decomposition of the precursor;
   wherein the adsorption and decomposition occur on the substrate surface without the presence of any other reactive chemical species or co-reactants.

2. The method according to claim 1, wherein the substrate comprises silicon, silicon oxide, silicon nitride, silicon carbide, gallium nitride, cobalt, ruthenium, copper, platinum, titanium, titanium nitride, tantalum, or tantalum nitride.

3. The method according to claim 1, wherein the precursor comprises 1,3,5-trisilacyclohexane (TSCH) or 1,3,5,7-tetrasilacyclooctane.

4. The method according to claim 1, wherein the SiC thin film has a Si:C atomic ratio of about 1:0.98 to 1:1.02.

5. The method according to claim 1, wherein a ratio of the integrated area under the Si—H bond peak at ~2080 $cm^{-1}$ for the SiC film as measured by infrared spectroscopy to the integrated area under the Si—C bond peak at ~730 $cm^{-1}$ as measured by infrared spectroscopy is less than about 1:50.

6. A method for producing an as-deposited SiC thin film containing not more than 0.2 atomic % hydrogen onto a substrate in a reaction zone of a deposition chamber, the method comprising:
   providing a substrate in a reaction zone of a deposition chamber;
   heating the substrate to a temperature of about 700° C. to about 850° C.; and
   providing a precursor comprising 1,3,5,7-tetrasilanonane; tricyclo[3.3.1.13,7]pentasilane; 1,3-disilacyclobutane; 1,3,5-trisilacyclohexane (TSCH); or 1,3,5,7-tetrasilacyclooctane in the vapor phase without a carrier gas to the reaction zone containing the substrate while maintaining the substrate at about 700° C. to about 850° C.;
   wherein a partial pressure of the precursor in the deposition chamber is maintained at about 10% to about 100% of a total pressure in the reaction zone;
   wherein a layer of SiC containing not more than 0.2 atomic % hydrogen is formed on a substrate surface by adsorption and decomposition of the precursor;
   wherein the adsorption and decomposition occur on the substrate surface without the presence of any other reactive chemical species or co-reactants.

7. The method according to claim 6, wherein the substrate comprises silicon, silicon oxide, silicon nitride, silicon carbide, gallium nitride, cobalt, ruthenium, copper, platinum, titanium, titanium nitride, tantalum, or tantalum nitride.

8. The method according to claim 6, wherein the precursor comprises 1,3,5-trisilacyclohexane (TSCH) or 1,3,5,7-tetrasilacyclooctane.

9. The method according to claim 6, wherein the SiC thin film has a Si:C atomic ratio of about 1:0.98 to 1:1.02.

10. The method according to claim 6, wherein a ratio of the integrated area under the Si—H bond peak at ~2080 $cm^{-1}$ for the SiC film as measured by infrared spectroscopy to the integrated area under the Si—C bond peak at ~730 $cm^{-1}$ as measured by infrared spectroscopy is less than about 1:50.

* * * * *